United States Patent
Zeng et al.

(10) Patent No.: US 9,042,051 B2
(45) Date of Patent: May 26, 2015

(54) GRADIENT WRITE GAP FOR PERPENDICULAR MAGNETIC RECORDING WRITER

(71) Applicant: Western Digital (Fremont), LLC, Fremont, CA (US)

(72) Inventors: Li Zeng, Fremont, CA (US); Dehua Han, Fremont, CA (US); Zhigang Bai, Fremont, CA (US); Lisha Wang, Fremont, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 0 days.

(21) Appl. No.: 14/096,503

(22) Filed: Dec. 4, 2013

(65) Prior Publication Data
US 2015/0049400 A1 Feb. 19, 2015

Related U.S. Application Data

(60) Provisional application No. 61/866,137, filed on Aug. 15, 2013.

(51) Int. Cl.
*G11B 5/23* (2006.01)
*C23C 16/40* (2006.01)
*G11B 5/187* (2006.01)

(52) U.S. Cl.
CPC .............. *G11B 5/232* (2013.01); *C23C 16/403* (2013.01); *G11B 5/1871* (2013.01)

(58) Field of Classification Search
CPC ..................................................... G11B 5/1272
USPC ......................................... 360/119.01–119.04
See application file for complete search history.

(56) References Cited

U.S. PATENT DOCUMENTS

| | | | |
|---|---|---|---|
| 6,016,290 A | 1/2000 | Chen et al. |
| 6,018,441 A | 1/2000 | Wu et al. |
| 6,025,978 A | 2/2000 | Hoshi et al. |
| 6,025,988 A | 2/2000 | Yan |
| 6,032,353 A | 3/2000 | Hiner et al. |
| 6,033,532 A | 3/2000 | Minami |
| 6,034,851 A | 3/2000 | Zarouri et al. |
| 6,043,959 A | 3/2000 | Crue et al. |
| 6,046,885 A | 4/2000 | Aimonetti et al. |
| 6,049,650 A | 4/2000 | Jerman et al. |
| 6,055,138 A | 4/2000 | Shi |
| 6,058,094 A | 5/2000 | Davis et al. |
| 6,073,338 A | 6/2000 | Liu et al. |
| 6,078,479 A | 6/2000 | Nepela et al. |
| 6,081,499 A | 6/2000 | Berger et al. |
| 6,094,803 A | 8/2000 | Carlson et al. |
| 6,099,362 A | 8/2000 | Viches et al. |
| 6,103,073 A | 8/2000 | Thayamballi |
| 6,108,166 A | 8/2000 | Lederman |

(Continued)

*Primary Examiner* — Joseph Feild
*Assistant Examiner* — Gustavo Polo

(57) ABSTRACT

The present disclosure provides for a magnetic writer pole for use in a hard drive. The magnetic writer pole comprises a first bevel formed by a non-magnetic layer, the first bevel formed at a first angle and extending to a first throat height. The magnetic writer pole further comprises a second bevel formed by the non-magnetic layer and extending distally from the first bevel at a second angle that is greater than the first angle and extending to a second throat height. The magnetic writer pole further comprises a third bevel formed by the non-magnetic layer and extending distally from the second bevel at a third angle that is greater than the second angle.

10 Claims, 7 Drawing Sheets

(56) References Cited

U.S. PATENT DOCUMENTS

| | | |
|---|---|---|
| 6,118,629 A | 9/2000 | Huai et al. |
| 6,118,638 A | 9/2000 | Knapp et al. |
| 6,125,018 A | 9/2000 | Takagishi et al. |
| 6,130,779 A | 10/2000 | Carlson et al. |
| 6,134,089 A | 10/2000 | Barr et al. |
| 6,136,166 A | 10/2000 | Shen et al. |
| 6,137,661 A | 10/2000 | Shi et al. |
| 6,137,662 A | 10/2000 | Huai et al. |
| 6,160,684 A | 12/2000 | Heist et al. |
| 6,163,426 A | 12/2000 | Nepela et al. |
| 6,166,891 A | 12/2000 | Lederman et al. |
| 6,173,486 B1 | 1/2001 | Hsiao et al. |
| 6,175,476 B1 | 1/2001 | Huai et al. |
| 6,178,066 B1 | 1/2001 | Barr |
| 6,178,070 B1 | 1/2001 | Hong et al. |
| 6,178,150 B1 | 1/2001 | Davis |
| 6,181,485 B1 | 1/2001 | He |
| 6,181,525 B1 | 1/2001 | Carlson |
| 6,185,051 B1 | 2/2001 | Chen et al. |
| 6,185,077 B1 | 2/2001 | Tong et al. |
| 6,185,081 B1 | 2/2001 | Simion et al. |
| 6,188,549 B1 | 2/2001 | Wiitala |
| 6,190,764 B1 | 2/2001 | Shi et al. |
| 6,193,584 B1 | 2/2001 | Rudy et al. |
| 6,195,229 B1 | 2/2001 | Shen et al. |
| 6,198,608 B1 | 3/2001 | Hong et al. |
| 6,198,609 B1 | 3/2001 | Barr et al. |
| 6,201,673 B1 | 3/2001 | Rottmayer et al. |
| 6,204,998 B1 | 3/2001 | Katz |
| 6,204,999 B1 | 3/2001 | Crue et al. |
| 6,212,153 B1 | 4/2001 | Chen et al. |
| 6,215,625 B1 | 4/2001 | Carlson |
| 6,219,205 B1 | 4/2001 | Yuan et al. |
| 6,221,218 B1 | 4/2001 | Shi et al. |
| 6,222,707 B1 | 4/2001 | Huai et al. |
| 6,229,782 B1 | 5/2001 | Wang et al. |
| 6,230,959 B1 | 5/2001 | Heist et al. |
| 6,233,116 B1 | 5/2001 | Chen et al. |
| 6,233,125 B1 | 5/2001 | Knapp et al. |
| 6,237,215 B1 | 5/2001 | Hunsaker et al. |
| 6,252,743 B1 | 6/2001 | Bozorgi |
| 6,255,721 B1 | 7/2001 | Roberts |
| 6,258,468 B1 | 7/2001 | Mahvan et al. |
| 6,266,216 B1 | 7/2001 | Hikami et al. |
| 6,271,604 B1 | 8/2001 | Frank, Jr. et al. |
| 6,275,354 B1 | 8/2001 | Huai et al. |
| 6,277,505 B1 | 8/2001 | Shi et al. |
| 6,282,056 B1 | 8/2001 | Feng et al. |
| 6,296,955 B1 | 10/2001 | Hossain et al. |
| 6,297,955 B1 | 10/2001 | Frank, Jr. et al. |
| 6,304,414 B1 | 10/2001 | Crue, Jr. et al. |
| 6,307,715 B1 | 10/2001 | Berding et al. |
| 6,310,746 B1 | 10/2001 | Hawwa et al. |
| 6,310,750 B1 | 10/2001 | Hawwa et al. |
| 6,317,290 B1 | 11/2001 | Wang et al. |
| 6,317,297 B1 | 11/2001 | Tong et al. |
| 6,322,911 B1 | 11/2001 | Fukagawa et al. |
| 6,330,136 B1 | 12/2001 | Wang et al. |
| 6,330,137 B1 | 12/2001 | Knapp et al. |
| 6,333,830 B2 | 12/2001 | Rose et al. |
| 6,340,533 B1 | 1/2002 | Ueno et al. |
| 6,342,311 B1 | 1/2002 | Inturi et al. |
| 6,349,014 B1 | 2/2002 | Crue, Jr. et al. |
| 6,351,355 B1 | 2/2002 | Min et al. |
| 6,353,318 B1 | 3/2002 | Sin et al. |
| 6,353,511 B1 | 3/2002 | Shi et al. |
| 6,356,412 B1 | 3/2002 | Levi et al. |
| 6,359,779 B1 | 3/2002 | Frank, Jr. et al. |
| 6,369,983 B1 | 4/2002 | Hong |
| 6,376,964 B1 | 4/2002 | Young et al. |
| 6,377,535 B1 | 4/2002 | Chen et al. |
| 6,381,095 B1 | 4/2002 | Sin et al. |
| 6,381,105 B1 | 4/2002 | Huai et al. |
| 6,389,499 B1 | 5/2002 | Frank, Jr. et al. |
| 6,392,850 B1 | 5/2002 | Tong et al. |
| 6,396,660 B1 | 5/2002 | Jensen et al. |
| 6,399,179 B1 | 6/2002 | Hanrahan et al. |
| 6,400,526 B2 | 6/2002 | Crue, Jr. et al. |
| 6,404,600 B1 | 6/2002 | Hawwa et al. |
| 6,404,601 B1 | 6/2002 | Rottmayer et al. |
| 6,404,706 B1 | 6/2002 | Stovall et al. |
| 6,410,170 B1 | 6/2002 | Chen et al. |
| 6,411,522 B1 | 6/2002 | Frank, Jr. et al. |
| 6,417,998 B1 | 7/2002 | Crue, Jr. et al. |
| 6,417,999 B1 | 7/2002 | Knapp et al. |
| 6,418,000 B1 | 7/2002 | Gibbons et al. |
| 6,418,048 B1 | 7/2002 | Sin et al. |
| 6,421,211 B1 | 7/2002 | Hawwa et al. |
| 6,421,212 B1 | 7/2002 | Gibbons et al. |
| 6,424,505 B1 | 7/2002 | Lam et al. |
| 6,424,507 B1 | 7/2002 | Lederman et al. |
| 6,430,009 B1 | 8/2002 | Komaki et al. |
| 6,430,806 B1 | 8/2002 | Chen et al. |
| 6,433,965 B1 | 8/2002 | Gopinathan et al. |
| 6,433,968 B1 | 8/2002 | Shi et al. |
| 6,433,970 B1 | 8/2002 | Knapp et al. |
| 6,437,945 B1 | 8/2002 | Hawwa et al. |
| 6,445,536 B1 | 9/2002 | Rudy et al. |
| 6,445,542 B1 | 9/2002 | Levi et al. |
| 6,445,553 B2 | 9/2002 | Barr et al. |
| 6,445,554 B1 | 9/2002 | Dong et al. |
| 6,447,935 B1 | 9/2002 | Zhang et al. |
| 6,448,765 B1 | 9/2002 | Chen et al. |
| 6,451,514 B1 | 9/2002 | Iitsuka |
| 6,452,742 B1 | 9/2002 | Crue et al. |
| 6,452,765 B1 | 9/2002 | Mahvan et al. |
| 6,456,465 B1 | 9/2002 | Louis et al. |
| 6,459,552 B1 | 10/2002 | Liu et al. |
| 6,462,920 B1 | 10/2002 | Karimi |
| 6,466,401 B1 | 10/2002 | Hong et al. |
| 6,466,402 B1 | 10/2002 | Crue, Jr. et al. |
| 6,466,404 B1 | 10/2002 | Crue, Jr. et al. |
| 6,468,436 B1 | 10/2002 | Shi et al. |
| 6,469,877 B1 | 10/2002 | Knapp et al. |
| 6,477,019 B2 | 11/2002 | Matono et al. |
| 6,479,096 B1 | 11/2002 | Shi et al. |
| 6,483,662 B1 | 11/2002 | Thomas et al. |
| 6,487,040 B1 | 11/2002 | Hsiao et al. |
| 6,487,056 B1 | 11/2002 | Gibbons et al. |
| 6,490,125 B1 | 12/2002 | Barr |
| 6,496,330 B1 | 12/2002 | Crue, Jr. et al. |
| 6,496,334 B1 | 12/2002 | Pang et al. |
| 6,504,676 B1 | 1/2003 | Hiner et al. |
| 6,512,657 B2 | 1/2003 | Heist et al. |
| 6,512,659 B1 | 1/2003 | Hawwa et al. |
| 6,512,661 B1 | 1/2003 | Louis |
| 6,512,690 B1 | 1/2003 | Qi et al. |
| 6,515,573 B1 | 2/2003 | Dong et al. |
| 6,515,791 B1 | 2/2003 | Hawwa et al. |
| 6,532,823 B1 | 3/2003 | Knapp et al. |
| 6,535,363 B1 | 3/2003 | Hosomi et al. |
| 6,552,874 B1 | 4/2003 | Chen et al. |
| 6,552,928 B1 | 4/2003 | Qi et al. |
| 6,562,487 B1 | 5/2003 | Vas'ko et al. |
| 6,577,470 B1 | 6/2003 | Rumpler |
| 6,583,961 B2 | 6/2003 | Levi et al. |
| 6,583,968 B1 | 6/2003 | Scura et al. |
| 6,597,548 B1 | 7/2003 | Yamanaka et al. |
| 6,611,398 B1 | 8/2003 | Rumpler et al. |
| 6,618,223 B1 | 9/2003 | Chen et al. |
| 6,629,357 B1 | 10/2003 | Akoh |
| 6,633,464 B2 | 10/2003 | Lai et al. |
| 6,636,394 B1 | 10/2003 | Fukagawa et al. |
| 6,639,291 B1 | 10/2003 | Sin et al. |
| 6,650,503 B1 | 11/2003 | Chen et al. |
| 6,650,506 B1 | 11/2003 | Risse |
| 6,654,195 B1 | 11/2003 | Frank, Jr. et al. |
| 6,657,816 B1 | 12/2003 | Barr et al. |
| 6,661,621 B1 | 12/2003 | Iitsuka |
| 6,661,625 B1 | 12/2003 | Sin et al. |
| 6,674,610 B1 | 1/2004 | Thomas et al. |
| 6,680,863 B1 | 1/2004 | Shi et al. |
| 6,683,763 B1 | 1/2004 | Hiner et al. |
| 6,687,098 B1 | 2/2004 | Huai |

(56) References Cited

U.S. PATENT DOCUMENTS

| | | |
|---|---|---|
| 6,687,178 B1 | 2/2004 | Qi et al. |
| 6,687,977 B2 | 2/2004 | Knapp et al. |
| 6,691,226 B1 | 2/2004 | Frank, Jr. et al. |
| 6,697,294 B1 | 2/2004 | Qi et al. |
| 6,700,738 B1 | 3/2004 | Sin et al. |
| 6,700,759 B1 | 3/2004 | Knapp et al. |
| 6,704,158 B2 | 3/2004 | Hawwa et al. |
| 6,707,083 B1 | 3/2004 | Hiner et al. |
| 6,713,801 B1 | 3/2004 | Sin et al. |
| 6,721,138 B1 | 4/2004 | Chen et al. |
| 6,721,149 B1 | 4/2004 | Shi et al. |
| 6,721,203 B1 | 4/2004 | Qi et al. |
| 6,724,569 B1 | 4/2004 | Chen et al. |
| 6,724,572 B1 | 4/2004 | Stoev et al. |
| 6,729,015 B2 | 5/2004 | Matono et al. |
| 6,735,850 B1 | 5/2004 | Gibbons et al. |
| 6,737,281 B1 | 5/2004 | Dang et al. |
| 6,744,608 B1 | 6/2004 | Sin et al. |
| 6,747,301 B1 | 6/2004 | Hiner et al. |
| 6,751,055 B1 | 6/2004 | Alfoqaha et al. |
| 6,754,049 B1 | 6/2004 | Seagle et al. |
| 6,756,071 B1 | 6/2004 | Shi et al. |
| 6,757,140 B1 | 6/2004 | Hawwa |
| 6,760,196 B1 | 7/2004 | Niu et al. |
| 6,762,910 B1 | 7/2004 | Knapp et al. |
| 6,765,756 B1 | 7/2004 | Hong et al. |
| 6,775,902 B1 | 8/2004 | Huai et al. |
| 6,778,358 B1 | 8/2004 | Jiang et al. |
| 6,781,927 B1 | 8/2004 | Heanuc et al. |
| 6,785,955 B1 | 9/2004 | Chen et al. |
| 6,791,793 B1 | 9/2004 | Chen et al. |
| 6,791,807 B1 | 9/2004 | Hikami et al. |
| 6,798,616 B1 | 9/2004 | Seagle et al. |
| 6,798,625 B1 | 9/2004 | Ueno et al. |
| 6,801,408 B1 | 10/2004 | Chen et al. |
| 6,801,411 B1 | 10/2004 | Lederman et al. |
| 6,803,615 B1 | 10/2004 | Sin et al. |
| 6,806,035 B1 | 10/2004 | Atireklapvarodom et al. |
| 6,807,030 B1 | 10/2004 | Hawwa et al. |
| 6,807,332 B1 | 10/2004 | Hawwa |
| 6,809,899 B1 | 10/2004 | Chen et al. |
| 6,816,345 B1 | 11/2004 | Knapp et al. |
| 6,828,897 B1 | 12/2004 | Nepela |
| 6,829,160 B1 | 12/2004 | Qi et al. |
| 6,829,819 B1 | 12/2004 | Crue, Jr. et al. |
| 6,833,979 B1 | 12/2004 | Knapp et al. |
| 6,834,010 B1 | 12/2004 | Qi et al. |
| 6,859,343 B1 | 2/2005 | Alfoqaha et al. |
| 6,859,997 B1 | 3/2005 | Tong et al. |
| 6,861,937 B1 | 3/2005 | Feng et al. |
| 6,870,712 B2 | 3/2005 | Chen et al. |
| 6,873,494 B2 | 3/2005 | Chen et al. |
| 6,873,547 B1 | 3/2005 | Shi et al. |
| 6,879,464 B2 | 4/2005 | Sun et al. |
| 6,888,184 B1 | 5/2005 | Shi et al. |
| 6,888,704 B1 | 5/2005 | Diao et al. |
| 6,891,702 B1 | 5/2005 | Tang |
| 6,894,871 B2 | 5/2005 | Alfoqaha et al. |
| 6,894,877 B1 | 5/2005 | Crue, Jr. et al. |
| 6,906,894 B2 | 6/2005 | Chen et al. |
| 6,909,578 B1 | 6/2005 | Missell et al. |
| 6,912,106 B1 | 6/2005 | Chen et al. |
| 6,934,113 B1 | 8/2005 | Chen |
| 6,934,129 B1 | 8/2005 | Zhang et al. |
| 6,940,688 B2 | 9/2005 | Jiang et al. |
| 6,942,824 B1 | 9/2005 | Li |
| 6,943,993 B2 | 9/2005 | Chang et al. |
| 6,944,938 B1 | 9/2005 | Crue, Jr. et al. |
| 6,947,258 B1 | 9/2005 | Li |
| 6,950,266 B1 | 9/2005 | McCaslin et al. |
| 6,954,332 B1 | 10/2005 | Hong et al. |
| 6,958,885 B1 | 10/2005 | Chen et al. |
| 6,961,221 B1 | 11/2005 | Niu et al. |
| 6,969,989 B1 | 11/2005 | Mei |
| 6,975,486 B2 | 12/2005 | Chen et al. |
| 6,987,643 B1 | 1/2006 | Seagle |
| 6,989,962 B1 | 1/2006 | Dong et al. |
| 6,989,972 B1 | 1/2006 | Stoev et al. |
| 7,006,327 B2 | 2/2006 | Krounbi et al. |
| 7,007,372 B1 | 3/2006 | Chen et al. |
| 7,012,832 B1 | 3/2006 | Sin et al. |
| 7,023,658 B1 | 4/2006 | Knapp et al. |
| 7,026,063 B2 | 4/2006 | Ueno et al. |
| 7,027,268 B1 | 4/2006 | Zhu et al. |
| 7,027,274 B1 | 4/2006 | Sin et al. |
| 7,035,046 B1 | 4/2006 | Young et al. |
| 7,041,985 B1 | 5/2006 | Wang et al. |
| 7,046,490 B1 | 5/2006 | Ueno et al. |
| 7,054,113 B1 | 5/2006 | Seagle et al. |
| 7,057,857 B1 | 6/2006 | Niu et al. |
| 7,059,868 B1 | 6/2006 | Yan |
| 7,070,698 B2 | 7/2006 | Le |
| 7,092,195 B1 | 8/2006 | Liu et al. |
| 7,110,289 B1 | 9/2006 | Sin et al. |
| 7,111,382 B1 | 9/2006 | Knapp et al. |
| 7,113,366 B1 | 9/2006 | Wang et al. |
| 7,114,241 B2 | 10/2006 | Kubota et al. |
| 7,116,517 B1 | 10/2006 | He et al. |
| 7,124,654 B1 | 10/2006 | Davies et al. |
| 7,126,788 B1 | 10/2006 | Liu et al. |
| 7,126,790 B1 | 10/2006 | Liu et al. |
| 7,131,346 B1 | 11/2006 | Buttar et al. |
| 7,133,253 B1 | 11/2006 | Seagle et al. |
| 7,134,185 B1 | 11/2006 | Knapp et al. |
| 7,154,715 B2 | 12/2006 | Yamanaka et al. |
| 7,170,725 B1 | 1/2007 | Zhou et al. |
| 7,177,117 B1 | 2/2007 | Jiang et al. |
| 7,193,815 B1 | 3/2007 | Stoev et al. |
| 7,196,880 B1 | 3/2007 | Anderson et al. |
| 7,199,973 B2 | 4/2007 | Lille |
| 7,199,974 B1 | 4/2007 | Alfoqaha |
| 7,199,975 B1 | 4/2007 | Pan |
| 7,211,339 B1 | 5/2007 | Seagle et al. |
| 7,212,379 B2 | 5/2007 | Hsu et al. |
| 7,212,380 B2 | 5/2007 | Hsiao et al. |
| 7,212,384 B1 | 5/2007 | Stoev et al. |
| 7,238,292 B1 | 7/2007 | He et al. |
| 7,239,478 B1 | 7/2007 | Sin et al. |
| 7,248,431 B1 | 7/2007 | Liu et al. |
| 7,248,433 B1 | 7/2007 | Stoev et al. |
| 7,248,449 B1 | 7/2007 | Seagle |
| 7,271,982 B2 | 9/2007 | MacDonald et al. |
| 7,280,325 B1 | 10/2007 | Pan |
| 7,283,327 B1 | 10/2007 | Liu et al. |
| 7,284,316 B1 | 10/2007 | Huai et al. |
| 7,286,329 B1 | 10/2007 | Chen et al. |
| 7,289,303 B1 | 10/2007 | Sin et al. |
| 7,292,409 B1 | 11/2007 | Stoev et al. |
| 7,296,337 B2 | 11/2007 | McFadyen |
| 7,296,339 B1 | 11/2007 | Yang et al. |
| 7,307,814 B1 | 12/2007 | Seagle et al. |
| 7,307,818 B1 | 12/2007 | Park et al. |
| 7,310,204 B1 | 12/2007 | Stoev et al. |
| 7,318,947 B1 | 1/2008 | Park et al. |
| 7,332,095 B2 | 2/2008 | Johnston et al. |
| 7,333,295 B1 | 2/2008 | Medina et al. |
| 7,337,530 B1 | 3/2008 | Stoev et al. |
| 7,342,752 B1 | 3/2008 | Zhang et al. |
| 7,343,667 B2 | 3/2008 | Lille |
| 7,349,170 B1 | 3/2008 | Rudman et al. |
| 7,349,179 B1 | 3/2008 | He et al. |
| 7,354,664 B1 | 4/2008 | Jiang et al. |
| 7,363,697 B1 | 4/2008 | Dunn et al. |
| 7,371,152 B1 | 5/2008 | Newman |
| 7,372,665 B1 | 5/2008 | Stoev et al. |
| 7,375,926 B1 | 5/2008 | Stoev et al. |
| 7,377,024 B1 | 5/2008 | Chen |
| 7,379,269 B1 | 5/2008 | Krounbi et al. |
| 7,386,933 B1 | 6/2008 | Krounbi et al. |
| 7,389,577 B1 | 6/2008 | Shang et al. |
| 7,417,824 B2 | 8/2008 | Kameda |
| 7,417,832 B1 | 8/2008 | Erickson et al. |
| 7,419,891 B1 | 9/2008 | Chen et al. |
| 7,428,124 B1 | 9/2008 | Song et al. |

(56) References Cited

U.S. PATENT DOCUMENTS

| | | |
|---|---|---|
| 7,430,098 B1 | 9/2008 | Song et al. |
| 7,436,620 B1 | 10/2008 | Kang et al. |
| 7,436,638 B1 | 10/2008 | Pan |
| 7,440,220 B1 | 10/2008 | Kang et al. |
| 7,440,230 B2 | 10/2008 | Hsu et al. |
| 7,443,632 B1 | 10/2008 | Stoev et al. |
| 7,444,740 B1 | 11/2008 | Chung et al. |
| 7,446,980 B2 | 11/2008 | Le |
| 7,468,862 B2 | 12/2008 | Sasaki et al. |
| 7,493,688 B1 | 2/2009 | Wang et al. |
| 7,506,431 B2 | 3/2009 | Hsiao et al. |
| 7,508,627 B1 | 3/2009 | Zhang et al. |
| 7,522,377 B1 | 4/2009 | Jiang et al. |
| 7,522,379 B1 | 4/2009 | Krounbi et al. |
| 7,522,382 B1 | 4/2009 | Pan |
| 7,532,432 B2 | 5/2009 | Ikeda et al. |
| 7,542,246 B1 | 6/2009 | Song et al. |
| 7,551,406 B1 | 6/2009 | Thomas et al. |
| 7,552,523 B1 | 6/2009 | He et al. |
| 7,554,767 B1 | 6/2009 | Hu et al. |
| 7,558,019 B2 | 7/2009 | Le et al. |
| 7,562,437 B2 | 7/2009 | Pentek et al. |
| 7,576,951 B2 | 8/2009 | Allen et al. |
| 7,583,466 B2 | 9/2009 | Kermiche et al. |
| 7,595,967 B1 | 9/2009 | Moon et al. |
| 7,633,713 B2 | 12/2009 | Chen et al. |
| 7,639,457 B1 | 12/2009 | Chen et al. |
| 7,660,080 B1 | 2/2010 | Liu et al. |
| 7,672,080 B1 | 3/2010 | Tang et al. |
| 7,672,086 B1 | 3/2010 | Jiang |
| 7,684,160 B1 | 3/2010 | Erickson et al. |
| 7,688,546 B1 | 3/2010 | Bai et al. |
| 7,691,434 B1 | 4/2010 | Zhang et al. |
| 7,695,761 B1 | 4/2010 | Shen et al. |
| 7,712,206 B2 | 5/2010 | Jiang et al. |
| 7,719,795 B2 | 5/2010 | Hu et al. |
| 7,726,009 B1 | 6/2010 | Liu et al. |
| 7,729,086 B1 | 6/2010 | Song et al. |
| 7,729,087 B1 | 6/2010 | Stoev et al. |
| 7,736,823 B1 | 6/2010 | Wang et al. |
| 7,748,104 B2 | 7/2010 | Bonhote et al. |
| 7,757,380 B2 | 7/2010 | Baer et al. |
| 7,768,743 B2 | 8/2010 | Guthrie et al. |
| 7,770,281 B2 | 8/2010 | Pentek |
| 7,777,988 B2 | 8/2010 | Guan et al. |
| 7,785,666 B1 | 8/2010 | Sun et al. |
| 7,788,797 B2 | 9/2010 | Kim et al. |
| 7,793,406 B2 | 9/2010 | Zheng |
| 7,796,356 B1 | 9/2010 | Fowler et al. |
| 7,800,858 B1 | 9/2010 | Bajikar et al. |
| 7,804,666 B2 | 9/2010 | Guan et al. |
| 7,819,979 B1 | 10/2010 | Chen et al. |
| 7,821,736 B2 | 10/2010 | Che et al. |
| 7,829,264 B1 | 11/2010 | Wang et al. |
| 7,846,643 B1 | 12/2010 | Sun et al. |
| 7,855,854 B2 | 12/2010 | Hu et al. |
| 7,869,160 B1 | 1/2011 | Pan et al. |
| 7,872,824 B1 | 1/2011 | Macchioni et al. |
| 7,872,833 B2 | 1/2011 | Hu et al. |
| 7,894,159 B2 | 2/2011 | Lengsfield, III et al. |
| 7,898,766 B1 | 3/2011 | Guan et al. |
| 7,910,267 B1 | 3/2011 | Zeng et al. |
| 7,911,735 B1 | 3/2011 | Sin et al. |
| 7,911,737 B1 | 3/2011 | Jiang et al. |
| 7,916,426 B2 | 3/2011 | Hu et al. |
| 7,918,013 B1 | 4/2011 | Dunn et al. |
| 7,920,358 B2 | 4/2011 | Jiang et al. |
| 7,968,219 B1 | 6/2011 | Jiang et al. |
| 7,969,684 B2 | 6/2011 | Le et al. |
| 7,982,989 B1 | 7/2011 | Shi et al. |
| 7,995,307 B2 | 8/2011 | Zheng |
| 8,008,912 B1 | 8/2011 | Shang |
| 8,012,804 B1 | 9/2011 | Wang et al. |
| 8,015,692 B1 | 9/2011 | Zhang et al. |
| 8,018,677 B1 | 9/2011 | Chung et al. |
| 8,018,678 B1 | 9/2011 | Zhang et al. |
| 8,018,679 B2 | 9/2011 | Hsiao et al. |
| 8,024,748 B1 | 9/2011 | Moravec et al. |
| 8,031,433 B2 | 10/2011 | Yan et al. |
| 8,036,069 B1 | 10/2011 | Jin et al. |
| 8,051,552 B2 | 11/2011 | Jiang et al. |
| 8,066,892 B2 | 11/2011 | Guthrie et al. |
| 8,072,705 B1 | 12/2011 | Wang et al. |
| 8,074,345 B1 | 12/2011 | Anguelouch et al. |
| 8,077,418 B1 | 12/2011 | Hu et al. |
| 8,077,434 B1 | 12/2011 | Shen et al. |
| 8,077,435 B1 | 12/2011 | Liu et al. |
| 8,077,557 B1 | 12/2011 | Hu et al. |
| 8,079,135 B1 | 12/2011 | Shen et al. |
| 8,081,403 B1 | 12/2011 | Chen et al. |
| 8,091,210 B1 | 1/2012 | Sasaki et al. |
| 8,097,846 B1 | 1/2012 | Anguelouch et al. |
| 8,104,166 B1 | 1/2012 | Zhang et al. |
| 8,111,479 B2 | 2/2012 | Chen et al. |
| 8,116,043 B2 | 2/2012 | Leng et al. |
| 8,116,171 B1 | 2/2012 | Lee |
| 8,125,856 B1 | 2/2012 | Li et al. |
| 8,134,794 B1 | 3/2012 | Wang |
| 8,136,224 B1 | 3/2012 | Sun et al. |
| 8,136,225 B1 | 3/2012 | Zhang et al. |
| 8,136,805 B1 | 3/2012 | Lee |
| 8,141,235 B1 | 3/2012 | Zhang |
| 8,146,236 B1 | 4/2012 | Luo et al. |
| 8,149,536 B1 | 4/2012 | Yang et al. |
| 8,151,441 B1 | 4/2012 | Rudy et al. |
| 8,163,185 B1 | 4/2012 | Sun et al. |
| 8,164,760 B2 | 4/2012 | Willis |
| 8,164,855 B1 | 4/2012 | Gibbons et al. |
| 8,164,864 B2 | 4/2012 | Kaiser et al. |
| 8,165,709 B1 | 4/2012 | Rudy |
| 8,166,631 B1 | 5/2012 | Tran et al. |
| 8,166,632 B1 | 5/2012 | Zhang et al. |
| 8,169,473 B1 | 5/2012 | Yu et al. |
| 8,171,618 B1 | 5/2012 | Wang et al. |
| 8,179,636 B1 | 5/2012 | Bai et al. |
| 8,191,237 B1 | 6/2012 | Luo et al. |
| 8,194,365 B1 | 6/2012 | Leng et al. |
| 8,194,366 B1 | 6/2012 | Li et al. |
| 8,196,285 B1 | 6/2012 | Zhang et al. |
| 8,200,054 B1 | 6/2012 | Li et al. |
| 8,201,320 B2 | 6/2012 | Allen et al. |
| 8,203,800 B2 | 6/2012 | Li et al. |
| 8,208,350 B1 | 6/2012 | Hu et al. |
| 8,220,140 B1 | 7/2012 | Wang et al. |
| 8,222,599 B1 | 7/2012 | Chien |
| 8,225,488 B1 | 7/2012 | Zhang et al. |
| 8,227,023 B1 | 7/2012 | Liu et al. |
| 8,228,633 B1 | 7/2012 | Tran et al. |
| 8,231,796 B1 | 7/2012 | Li et al. |
| 8,233,235 B2 | 7/2012 | Chen et al. |
| 8,233,248 B1 | 7/2012 | Li et al. |
| 8,238,056 B2 | 8/2012 | Guan et al. |
| 8,248,728 B2 | 8/2012 | Yamaguchi et al. |
| 8,248,896 B1 | 8/2012 | Yuan et al. |
| 8,254,060 B1 | 8/2012 | Shi et al. |
| 8,257,597 B1 | 9/2012 | Guan et al. |
| 8,259,410 B1 | 9/2012 | Bai et al. |
| 8,259,539 B1 | 9/2012 | Hu et al. |
| 8,262,918 B1 | 9/2012 | Li et al. |
| 8,262,919 B1 | 9/2012 | Luo et al. |
| 8,264,792 B2 | 9/2012 | Bai et al. |
| 8,264,797 B2 | 9/2012 | Emley |
| 8,264,798 B1 | 9/2012 | Guan et al. |
| 8,270,126 B1 | 9/2012 | Roy et al. |
| 8,276,258 B1 | 10/2012 | Tran et al. |
| 8,277,669 B1 | 10/2012 | Chen et al. |
| 8,279,719 B1 | 10/2012 | Hu et al. |
| 8,284,517 B1 | 10/2012 | Sun et al. |
| 8,288,204 B1 | 10/2012 | Wang et al. |
| 8,289,821 B1 | 10/2012 | Huber |
| 8,291,743 B1 | 10/2012 | Shi et al. |
| 8,295,132 B2 | 10/2012 | Jin et al. |
| 8,300,358 B2 | 10/2012 | Maruyama et al. |
| 8,307,539 B1 | 11/2012 | Rudy et al. |

(56) References Cited

U.S. PATENT DOCUMENTS

| | | |
|---|---|---|
| 8,307,540 B1 | 11/2012 | Tran et al. |
| 8,308,921 B1 | 11/2012 | Hiner et al. |
| 8,310,785 B1 | 11/2012 | Zhang et al. |
| 8,310,901 B1 | 11/2012 | Batra et al. |
| 8,315,019 B1 | 11/2012 | Mao et al. |
| 8,316,527 B2 | 11/2012 | Hong et al. |
| 8,320,076 B1 | 11/2012 | Shen et al. |
| 8,320,077 B1 | 11/2012 | Tang et al. |
| 8,320,219 B1 | 11/2012 | Wolf et al. |
| 8,320,220 B1 | 11/2012 | Yuan et al. |
| 8,320,722 B1 | 11/2012 | Yuan et al. |
| 8,322,022 B1 | 12/2012 | Yi et al. |
| 8,322,023 B1 | 12/2012 | Zeng et al. |
| 8,323,727 B2 | 12/2012 | Pentek et al. |
| 8,325,569 B1 | 12/2012 | Shi et al. |
| 8,333,008 B1 | 12/2012 | Sin et al. |
| 8,334,093 B2 | 12/2012 | Zhang et al. |
| 8,336,194 B2 | 12/2012 | Yuan et al. |
| 8,339,738 B1 | 12/2012 | Tran et al. |
| 8,339,749 B2 | 12/2012 | Mochizuki et al. |
| 8,341,826 B1 | 1/2013 | Jiang et al. |
| 8,343,319 B1 | 1/2013 | Li et al. |
| 8,343,364 B1 | 1/2013 | Gao et al. |
| 8,345,383 B2 | 1/2013 | Yan et al. |
| 8,347,488 B2 | 1/2013 | Hong et al. |
| 8,349,195 B1 | 1/2013 | Si et al. |
| 8,351,307 B1 | 1/2013 | Wolf et al. |
| 8,355,222 B2 | 1/2013 | Mino et al. |
| 8,357,244 B1 | 1/2013 | Zhao et al. |
| 8,373,945 B1 | 2/2013 | Luo et al. |
| 8,375,564 B1 | 2/2013 | Luo et al. |
| 8,375,565 B2 | 2/2013 | Hu et al. |
| 8,381,391 B2 | 2/2013 | Park et al. |
| 8,385,157 B1 | 2/2013 | Champion et al. |
| 8,385,158 B1 | 2/2013 | Hu et al. |
| 8,394,280 B1 | 3/2013 | Wan et al. |
| 8,400,731 B1 | 3/2013 | Li et al. |
| 8,404,128 B1 | 3/2013 | Zhang et al. |
| 8,404,129 B1 | 3/2013 | Luo et al. |
| 8,405,930 B1 | 3/2013 | Li et al. |
| 8,409,453 B1 | 4/2013 | Jiang et al. |
| 8,413,317 B1 | 4/2013 | Wan et al. |
| 8,416,540 B1 | 4/2013 | Li et al. |
| 8,419,953 B1 | 4/2013 | Su et al. |
| 8,419,954 B1 | 4/2013 | Chen et al. |
| 8,422,176 B1 | 4/2013 | Leng et al. |
| 8,422,342 B1 | 4/2013 | Lee |
| 8,422,841 B1 | 4/2013 | Shi et al. |
| 8,424,192 B1 | 4/2013 | Yang et al. |
| 8,441,756 B1 | 5/2013 | Sun et al. |
| 8,443,510 B1 | 5/2013 | Shi et al. |
| 8,444,866 B1 | 5/2013 | Guan et al. |
| 8,449,948 B2 | 5/2013 | Medina et al. |
| 8,451,556 B1 | 5/2013 | Wang et al. |
| 8,451,563 B1 | 5/2013 | Zhang et al. |
| 8,454,846 B1 | 6/2013 | Zhou et al. |
| 8,455,119 B1 | 6/2013 | Jiang et al. |
| 8,456,961 B1 | 6/2013 | Wang et al. |
| 8,456,963 B1 | 6/2013 | Hu et al. |
| 8,456,964 B1 | 6/2013 | Yuan et al. |
| 8,456,966 B1 | 6/2013 | Shi et al. |
| 8,456,967 B1 | 6/2013 | Mallary |
| 8,458,892 B2 | 6/2013 | Si et al. |
| 8,462,592 B1 | 6/2013 | Wolf et al. |
| 8,468,682 B1 | 6/2013 | Zhang |
| 8,470,186 B2 | 6/2013 | Chen et al. |
| 8,472,288 B1 | 6/2013 | Wolf et al. |
| 8,480,911 B1 | 7/2013 | Osugi et al. |
| 8,486,285 B2 | 7/2013 | Zhou et al. |
| 8,486,286 B1 | 7/2013 | Gao et al. |
| 8,488,272 B1 | 7/2013 | Tran et al. |
| 8,491,801 B1 | 7/2013 | Tanner et al. |
| 8,491,802 B1 | 7/2013 | Gao et al. |
| 8,493,693 B1 | 7/2013 | Zheng et al. |
| 8,493,695 B1 | 7/2013 | Kaiser et al. |
| 8,495,813 B1 | 7/2013 | Hu et al. |
| 8,498,084 B1 | 7/2013 | Leng et al. |
| 8,506,828 B1 | 8/2013 | Osugi et al. |
| 8,514,517 B1 | 8/2013 | Batra et al. |
| 8,518,279 B1 | 8/2013 | Wang et al. |
| 8,518,832 B1 | 8/2013 | Yang et al. |
| 8,520,336 B1 | 8/2013 | Liu et al. |
| 8,520,337 B1 | 8/2013 | Liu et al. |
| 8,524,068 B2 | 9/2013 | Medina et al. |
| 8,526,275 B1 | 9/2013 | Yuan et al. |
| 8,531,801 B1 | 9/2013 | Xiao et al. |
| 8,532,450 B1 | 9/2013 | Wang et al. |
| 8,533,937 B1 | 9/2013 | Wang et al. |
| 8,537,494 B1 | 9/2013 | Pan et al. |
| 8,537,495 B1 | 9/2013 | Luo et al. |
| 8,537,502 B1 | 9/2013 | Park et al. |
| 8,545,999 B1 | 10/2013 | Leng et al. |
| 8,547,659 B1 | 10/2013 | Bai et al. |
| 8,547,667 B1 | 10/2013 | Roy et al. |
| 8,547,730 B1 | 10/2013 | Shen et al. |
| 8,555,486 B1 | 10/2013 | Medina et al. |
| 8,559,141 B1 | 10/2013 | Pakala et al. |
| 8,563,146 B1 | 10/2013 | Zhang et al. |
| 8,565,049 B1 | 10/2013 | Tanner et al. |
| 8,576,517 B1 | 11/2013 | Tran et al. |
| 8,578,594 B2 | 11/2013 | Jiang et al. |
| 8,582,238 B1 | 11/2013 | Liu et al. |
| 8,582,241 B1 | 11/2013 | Yu et al. |
| 8,582,253 B1 | 11/2013 | Zheng et al. |
| 8,588,039 B1 | 11/2013 | Shi et al. |
| 8,593,914 B2 | 11/2013 | Wang et al. |
| 8,597,528 B1 | 12/2013 | Roy et al. |
| 8,599,520 B1 | 12/2013 | Liu et al. |
| 8,599,657 B1 | 12/2013 | Lee |
| 8,603,593 B1 | 12/2013 | Roy et al. |
| 8,607,438 B1 | 12/2013 | Gao et al. |
| 8,607,439 B1 | 12/2013 | Wang et al. |
| 8,611,035 B1 | 12/2013 | Bajikar et al. |
| 8,611,054 B1 | 12/2013 | Shang et al. |
| 8,611,055 B1 | 12/2013 | Pakala et al. |
| 8,614,864 B1 | 12/2013 | Hong et al. |
| 8,619,512 B1 | 12/2013 | Yuan et al. |
| 8,625,233 B1 | 1/2014 | Ji et al. |
| 8,625,941 B1 | 1/2014 | Shi et al. |
| 8,628,672 B1 | 1/2014 | Si et al. |
| 8,630,068 B1 | 1/2014 | Mauri et al. |
| 8,634,280 B1 | 1/2014 | Wang et al. |
| 8,638,529 B1 | 1/2014 | Leng et al. |
| 8,643,980 B1 | 2/2014 | Fowler et al. |
| 8,649,123 B1 | 2/2014 | Zhang et al. |
| 8,665,561 B1 | 3/2014 | Knutson et al. |
| 8,670,211 B1 | 3/2014 | Sun et al. |
| 8,670,213 B1 | 3/2014 | Zeng et al. |
| 8,670,214 B1 | 3/2014 | Knutson et al. |
| 8,670,294 B1 | 3/2014 | Shi et al. |
| 8,670,295 B1 | 3/2014 | Hu et al. |
| 8,675,318 B1 | 3/2014 | Ho et al. |
| 8,675,455 B1 | 3/2014 | Krichevsky et al. |
| 8,681,594 B1 | 3/2014 | Shi et al. |
| 8,689,430 B1 | 4/2014 | Chen et al. |
| 8,693,141 B1 | 4/2014 | Elliott et al. |
| 8,703,397 B1 | 4/2014 | Zeng et al. |
| 8,705,205 B1 * | 4/2014 | Li et al. .................. 360/125.13 |
| 8,711,518 B1 | 4/2014 | Zeng et al. |
| 8,711,528 B1 | 4/2014 | Xiao et al. |
| 8,717,709 B1 | 5/2014 | Shi et al. |
| 8,720,044 B1 | 5/2014 | Tran et al. |
| 8,721,902 B1 | 5/2014 | Wang et al. |
| 8,724,259 B1 | 5/2014 | Liu et al. |
| 8,749,790 B1 | 6/2014 | Tanner et al. |
| 8,749,920 B1 | 6/2014 | Knutson et al. |
| 8,753,903 B1 | 6/2014 | Tanner et al. |
| 8,760,807 B1 | 6/2014 | Zhang et al. |
| 8,760,818 B1 | 6/2014 | Diao et al. |
| 8,760,819 B1 | 6/2014 | Liu et al. |
| 8,760,822 B1 | 6/2014 | Li et al. |
| 8,760,823 B1 | 6/2014 | Chen et al. |
| 8,763,235 B1 | 7/2014 | Wang et al. |
| 8,780,498 B1 | 7/2014 | Jiang et al. |

(56) References Cited

U.S. PATENT DOCUMENTS

| | | |
|---|---|---|
| 8,780,505 B1 | 7/2014 | Xiao |
| 8,786,983 B1 | 7/2014 | Liu et al. |
| 8,790,524 B1 | 7/2014 | Luo et al. |
| 8,790,527 B1 | 7/2014 | Luo et al. |
| 8,792,208 B1 | 7/2014 | Liu et al. |
| 8,792,312 B1 | 7/2014 | Wang et al. |
| 8,793,866 B1 | 8/2014 | Zhang et al. |
| 8,797,680 B1 | 8/2014 | Luo et al. |
| 8,797,684 B1 | 8/2014 | Tran et al. |
| 8,797,686 B1 | 8/2014 | Bai et al. |
| 8,797,692 B1 | 8/2014 | Guo et al. |
| 8,813,324 B2 | 8/2014 | Emley et al. |
| 2002/0034043 A1 | 3/2002 | Okada et al. |
| 2005/0219747 A1 | 10/2005 | Hsu et al. |
| 2006/0268456 A1 | 11/2006 | Sasaki et al. |
| 2007/0230046 A1 | 10/2007 | Le et al. |
| 2007/0236831 A1 | 10/2007 | Che et al. |
| 2008/0002292 A1 | 1/2008 | Le et al. |
| 2008/0112082 A1 | 5/2008 | Guan et al. |
| 2008/0198507 A1 | 8/2008 | Maruyama et al. |
| 2008/0225441 A1 | 9/2008 | Yamada et al. |
| 2008/0259498 A1 | 10/2008 | Lengsfield et al. |
| 2008/0278861 A1 | 11/2008 | Jiang et al. |
| 2009/0002885 A1 | 1/2009 | Sin |
| 2009/0021863 A1 | 1/2009 | Zheng |
| 2009/0103211 A1 | 4/2009 | Chen et al. |
| 2009/0116145 A1 | 5/2009 | Guan et al. |
| 2009/0147410 A1 | 6/2009 | Jiang et al. |
| 2009/0154012 A1 | 6/2009 | Mochizuki et al. |
| 2009/0154019 A1 | 6/2009 | Hsiao et al. |
| 2009/0268344 A1 | 10/2009 | Guan et al. |
| 2010/0061016 A1 | 3/2010 | Han et al. |
| 2010/0165517 A1 | 7/2010 | Araki et al. |
| 2010/0172054 A1 | 7/2010 | Yamaguchi et al. |
| 2010/0277832 A1 | 11/2010 | Bai et al. |
| 2010/0290157 A1 | 11/2010 | Zhang et al. |
| 2011/0086240 A1 | 4/2011 | Xiang et al. |
| 2011/0134567 A1 | 6/2011 | Chen et al. |
| 2011/0134569 A1 | 6/2011 | Allen et al. |
| 2011/0151279 A1* | 6/2011 | Allen et al. ............ 428/815 |
| 2012/0026629 A1 | 2/2012 | Hirata et al. |
| 2012/0044598 A1 | 2/2012 | Bai et al. |
| 2012/0087042 A1 | 4/2012 | Zhou et al. |
| 2012/0111826 A1 | 5/2012 | Chen et al. |
| 2012/0216378 A1 | 8/2012 | Emley et al. |
| 2012/0237878 A1 | 9/2012 | Zeng et al. |
| 2012/0298621 A1 | 11/2012 | Gao |
| 2012/0314324 A1 | 12/2012 | Guan |
| 2013/0216702 A1 | 8/2013 | Kaiser et al. |
| 2013/0216863 A1 | 8/2013 | Li et al. |
| 2013/0257421 A1 | 10/2013 | Shang et al. |
| 2014/0154529 A1 | 6/2014 | Yang et al. |
| 2014/0175050 A1 | 6/2014 | Zhang et al. |

* cited by examiner

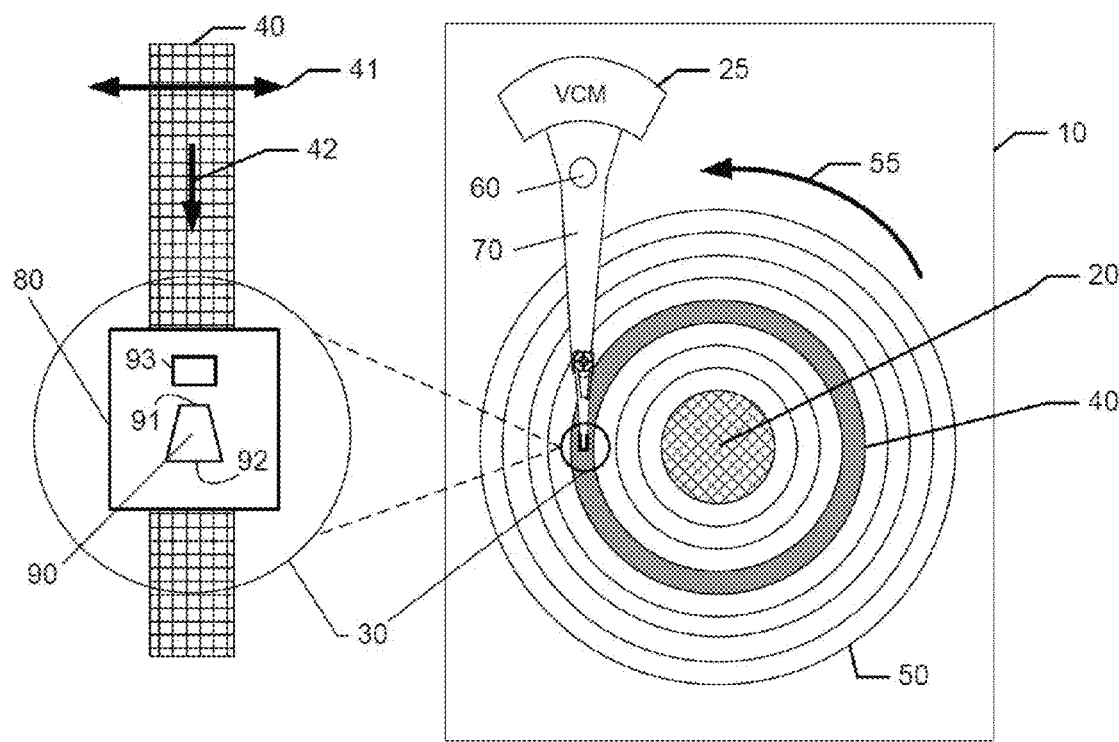
FIG. 1A  FIG. 1
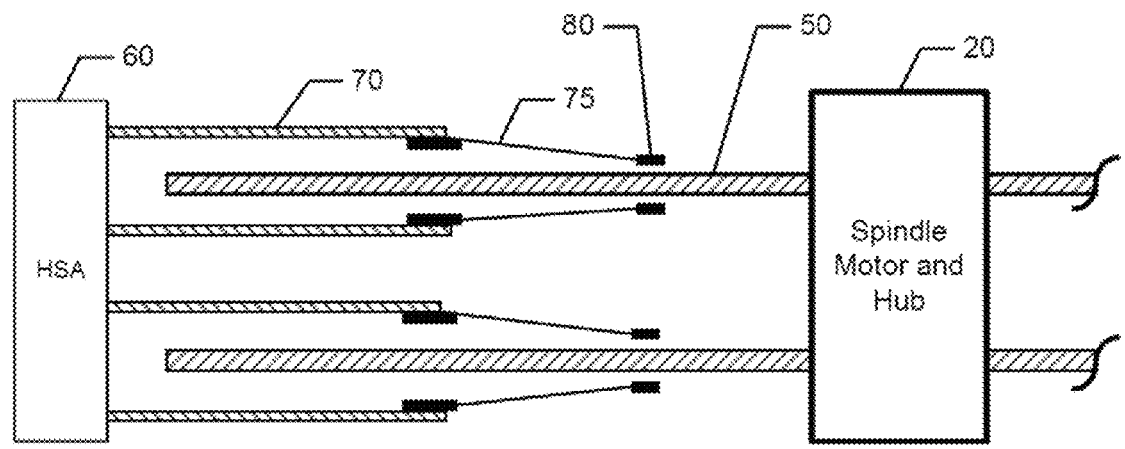
FIG. 2

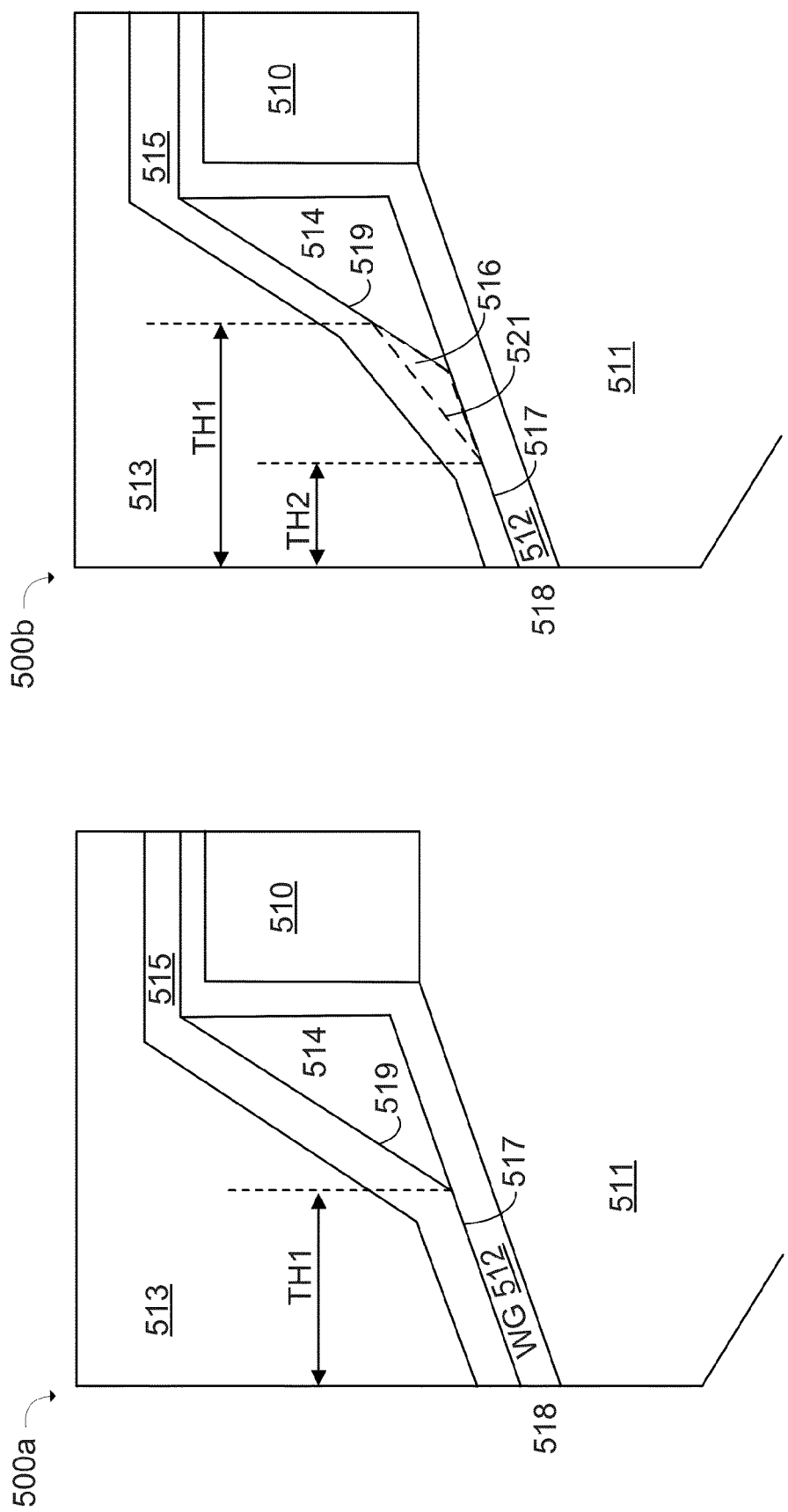

GRADIENT WRITE GAP FOR PERPENDICULAR MAGNETIC RECORDING WRITER

CROSS-REFERENCE TO RELATED APPLICATION

This application claims the benefit of U.S. Provisional Application Ser. No. 61/866,137 filed Aug. 15, 2013, the entire contents of which are herein incorporated by reference as if fully set forth herein.

DESCRIPTION OF THE RELATED ART

Disk drives typically use heads residing on sliders to read from and write to magnetic media. Read and write transducers residing in the head are flown at a small, controlled spacing above the magnetic medium (disk) during read and write operations. An air bearing forms between the head and the disk due to the disk rotating at high speeds, which provides controlled head to disk spacing. Magnetic fields emanating from the write transducer pole tip switch magnetization of the magnetic medium, i.e., writing to the medium.

FIG. 1 illustrates a conventional disk drive 10 used for data storage. Figures are not drawn to scale and only certain structures are depicted for clarity. A disk media 50 is attached to a spindle motor and hub 20. The spindle motor and hub 20 rotate the media 50 in a direction shown by arrow 55. A head stack assembly (HSA) 60 includes a magnetic recording head 30 on an actuator arm 70 and positions the actuator arm 70 by positioning the voice coil motor (VCM) 25 over a desired data track, shown as a recording track 40 in this example, to write data onto the media 50.

FIG. 1A illustrates an enlarged view of a section of FIG. 1 including the head 30 and the track 40. A magnetic recording transducer 90 is fabricated on a slider 80. The slider 80 may be attached to a suspension 75 and the suspension 75 may be attached to the actuator arm 70 as shown in FIG. 2. The slider 80 may include a read transducer 93.

Referring again to FIG. 1A, the slider 80 is illustrated above the recording track 40. The media 50 and the track 40 are moving under the slider 80 in a down-track direction shown by arrow 42. The cross-track direction is shown by arrow 41.

The magnetic recording transducer 90 has a leading edge 91 and a trailing edge 92. In this embodiment, the trailing edge 92 of the recording transducer 90 is the final portion of the magnetic transducer 90 that writes onto the recording track 40 as the media 50 moves under the slider 80 in the down-track direction 42.

FIG. 2 illustrates a side view of the disk drive 10 shown in FIG. 1. At least one disk media 50 is mounted onto the spindle motor and hub 20. Head Disk Assembly 60 comprises at least one actuator arm 70 that carries the suspension 75 and slider 80. The slider 80 has an air bearing surface (ABS) facing the media 50. When the media 50 is rotating and the actuator arm 70 is positioned over the media 50, the slider 80 slide above the media 50 by aerodynamic pressure created between the slider ABS and the surface of media 50.

FIG. 3 illustrates a perspective view of a main pole tip section 300 of a perpendicular magnetic recording (PMR) transducer that may be implemented on the slider 80 of FIG. 2. The main pole tip section 300 has a pole tip face 310 that faces the ABS. The pole tip face 310 is illustrated in a trapezoidal shape having a trailing edge 311, a leading edge 312, a first side wall edge 313, and a second side wall edge 314. The first side wall 340 extends distally from the first side wall edge 313, the second side wall 350 (not visible, opposite first side wall 340) extends distally from the second side wall edge 314, the trailing side wall 320 extends distally from the trailing edge 311, and the leading side wall 330 (not visible, opposite trailing side wall 320) extends distally from the leading edge 312.

The main pole tip section 300 is illustrated with a trapezoidal shape at the ABS with the trailing edge 311 wider than the leading edge 312. However, other shapes may also be used. In other embodiments, for example, the side wall edge 313 and the side wall edge 314 and the corresponding side wall 340 and the side wall 350 may have facets or a curved shape; the leading edge 312 may be small, or form a point; and a trapezoid shape is not required, and may be a rectangle, or another shape having side walls. Pole surfaces and edges illustrated with straight lines may also be implemented as curved or faceted. One ordinarily skilled in the art will recognize that these shapes, combinations or variations of these shapes, and other shapes may be used.

FIG. 4 illustrates a side section view of a PMR read/write head 400 having a write transducer 450 and read sensor 410, both facing the ABS 490. The read sensor 410 may include a first shield 411 and a second shield 413 as well as a sensor 412. The write transducer 450 includes a shield 414, a main pole 401, an assist pole (or auxiliary pole) 401', a coil 440 and a coil 440', a leading shield 417 and a trailing shield 420. The main pole 401 has a trailing bevel 401a and a leading bevel 401b. A leading nonmagnetic gap layer 415 separates main pole 401 from underlying structures, and a trailing nonmagnetic gap layer 405 separates main pole 401 from structures above. The trailing nonmagnetic gap layer 405 is also known as a "write gap." A non-magnetic spacer 406 may be included on a portion of the trailing bevel 401a to provide magnetic separation between the main pole 401 and the magnetic structures above. A nonmagnetic spacer layer 402 is illustrated on the non-beveled section of main pole 401; however, this nonmagnetic spacer layer 402 may be provided above main pole 401 beginning at any point distal from the ABS 490, including on the bevel 401a. A trailing seed layer 407 overlays trailing nonmagnetic gap layer 405 and spacer 406. A leading seed layer 416 is provided between leading nonmagnetic gap layer 415 and leading shield 417.

Magnetic fields emanating from the write gap switch magnetization of a magnetic medium, i.e., writing to the medium. Among other factors, a smaller and more tightly controlled magnetic writing field will allow more data to be written in the same space, thereby increasing areal density. As such, write gap characteristics play an important role in writer performance.

BRIEF DESCRIPTION OF THE DRAWINGS

The drawings are provided for purposes of illustration only and merely depict typical or example implementations. These drawings are provided to facilitate the reader's understanding and shall not be considered limiting of the breadth, scope, or applicability of the disclosure. For clarity and ease of illustration, these drawings are not necessarily to scale.

FIGS. 1 and 1A illustrate a top view of a conventional hard disk drive.

FIG. 2 illustrates a side view of a conventional hard disk drive.

FIG. 5A provides a close up side section view of a PMR writer structure having a constant width write gap.

FIG. 5B provides a close up side section view of a PMR writer having a gradient write gap, in accordance with an embodiment of the present disclosure.

DETAILED DESCRIPTION

Figure 3:
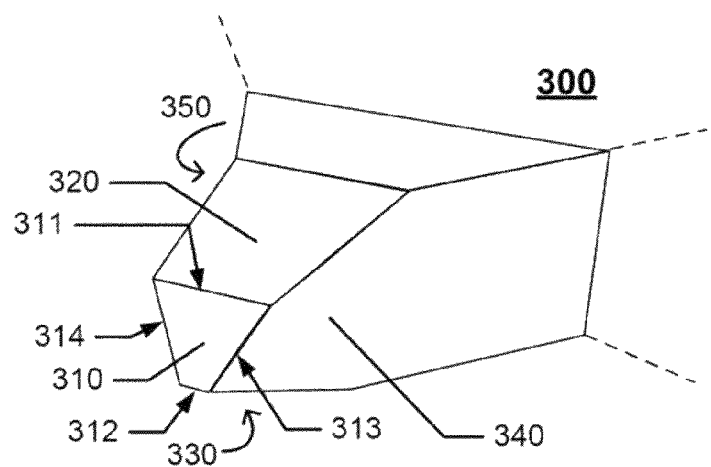
FIG. 3 provides a perspective view of a main pole tip section of a perpendicular magnetic recording (PMR) transducer.
Figure 4:
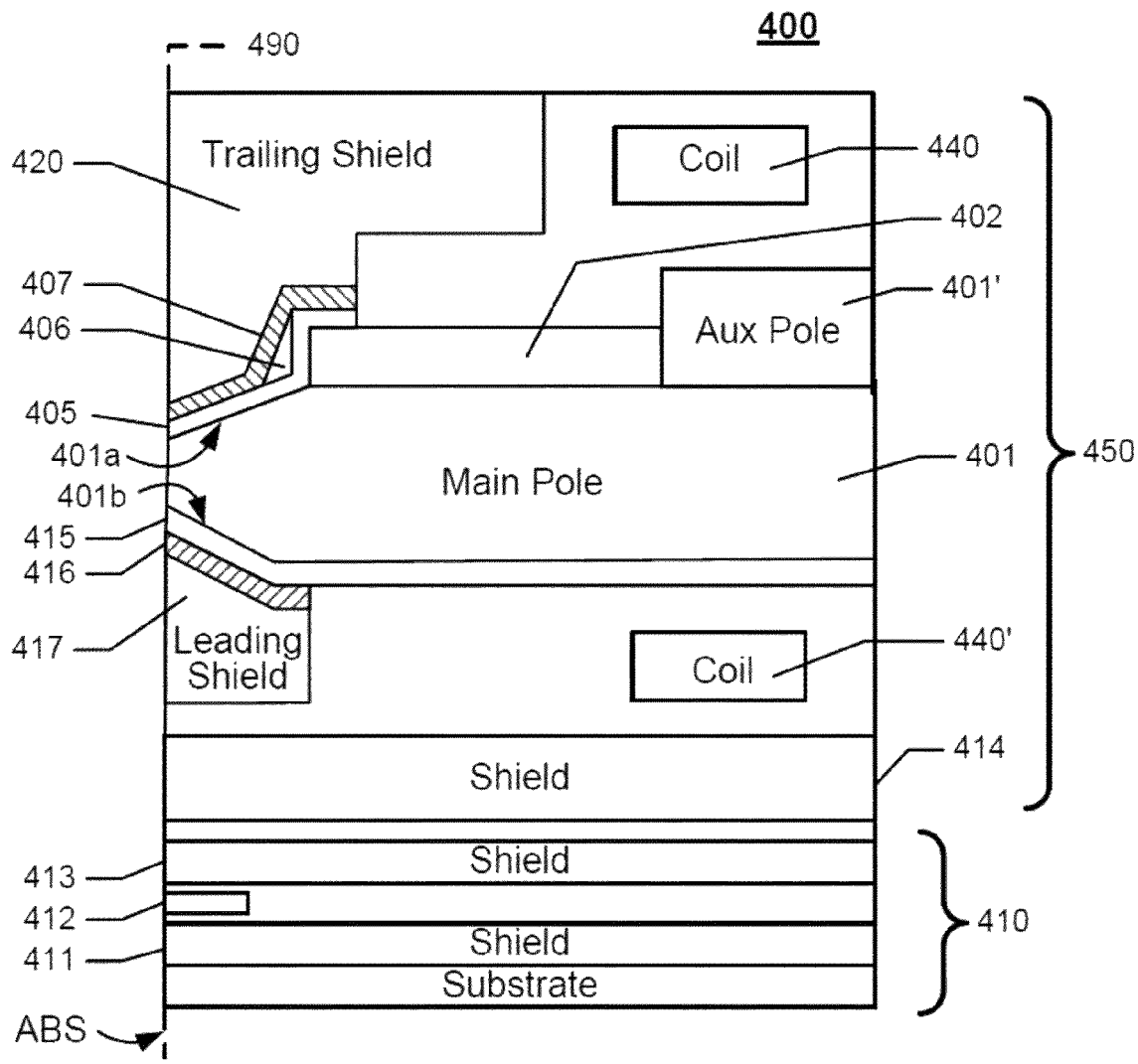
FIG. 4 provides a side section view of a PMR read/write head.

In the following description, numerous specific details are set forth to provide a thorough understanding of various embodiments of the present disclosure. It will be apparent, however, to one skilled in the art that these specific details need not be employed to practice various embodiments of the present disclosure. In other instances, well known components or methods have not been described in detail to avoid unnecessarily obscuring various embodiments of the present disclosure.

Perpendicular magnetic recording (PMR) writers are commonly used in today's hard drives. Write gap characteristics are an important aspect in high density PMR writers, particularly in PMR writers with linear densities beyond ~2000 kFCl. With increasing areal densities, write gap thickness continues to scale down and is generally tightly controlled by atomic layer depositions. Writer performance is very sensitive to write gap thickness. Generally, thin write gaps will directly improve signal-to-noise ratio (SNR), but degrade the reverse overwrite (revOW). However, improvements in revOW will generally result in performance losses in wide area track erasure (WATEr), as the improved signal strength will tend to lead to increased leakage into adjacent tracks. A small distance between the main pole and high moment magnetic shield (i.e., a thin write gap) will increase the field gradient at the air bearing surface (ABS), thus improving SNR. However, thin nonmagnetic write gaps also lead to magnetic flux shunting before the flux reaching the ABS, thereby hurting the revOW.

FIG. 5A shows a PMR writer structure 510a having a write gap (WG) 512 that leads into a non-magnetic spacer 514. The end of the write gap 512 opposite the non-magnetic spacer 514 interacts with an air-bearing surface 518. In this formulation, the write gap 512 has a generally constant width. The write gap 512 and the non-magnetic spacer 514 are each composed of non-magnetic material, and together form a non-magnetic layer between the main pole 511 and the trailing shield 513. A second non-magnetic spacer 210 may also form a part of the non-magnetic layer between the main pole 511 and the trailing shield 513. The trailing shield 513 may also comprise a magnetic seed layer 515. The thin write gap 512 improves the signal-to-noise ratio of the writer 510a. However, the abrupt change in width of the write gap 512 leading into the non-magnetic spacer 514 results in magnetic flux shunting before the flux reaches the air-bearing surface 518. The presently disclosed gradient write gap addresses these issues.

A PMR writer 510b incorporating a gradient write gap (GWG), in accordance with an embodiment of the present disclosure, is presented in FIG. 5B. A gradient write gap portion 516 is added as part of the write gap 512 to gradually increase the write gap's width as it moves toward the non-magnetic spacer 514. The gradient write gap portion 516, like the write gap 512, generally comprises non-magnetic material. Examples of such non-magnetic materials may include Ru or $Al_2O_3$.

The PMR writer 510a in FIG. 5A has a first bevel 517 formed by the write gap 512, which leads directly into a second bevel 519 formed by the non-magnetic spacer 514. The newly added gradient write gap portion 516 in FIG. 5B creates a third bevel 521 that forms an angle that is greater than the angle formed by the first bevel 517, and smaller than that formed by the second bevel 519. In this way, a gradient is formed from the write gap 512 to the non-magnetic spacer 514.

In the structure depicted in FIG. 5B, the write gap 512 has a thin opening at the air bearing surface 518, which increases the write head's signal-to-noise ratio (SNR). However, the thickness of the gradient write gap gradually increases as it moves away from the ABS 518 towards the non-magnetic spacer 514, thereby reducing flux shunting. In this way, the benefit of an increased SNR is obtained, while simultaneously protecting against the problem of flux shunting by gradually increasing the write gap width. This can greatly improve device performance.

Figure 6B:
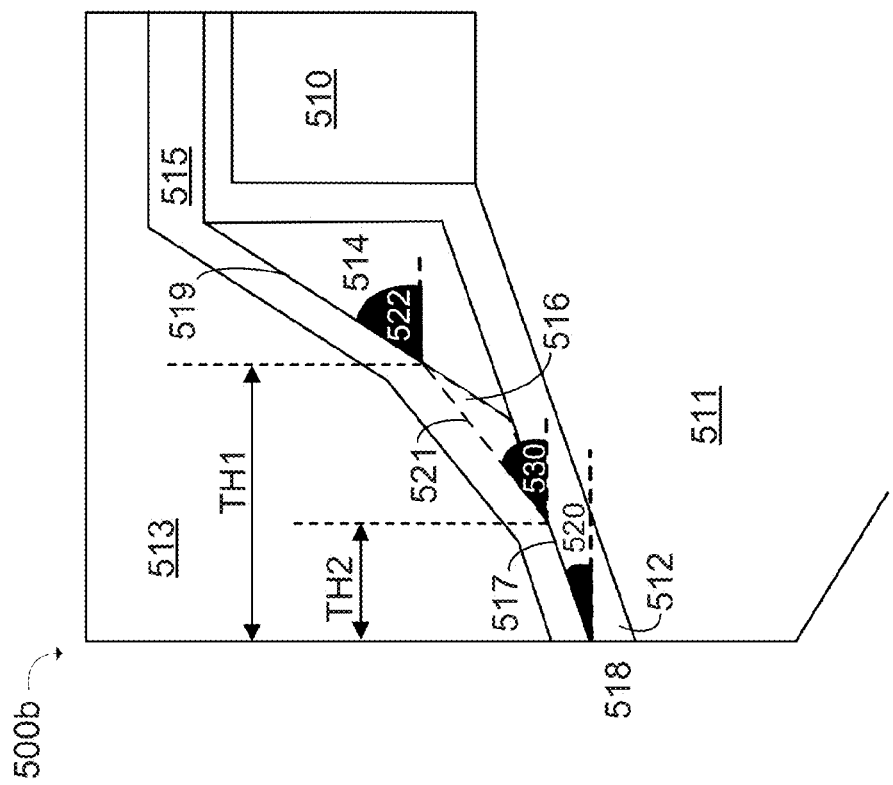
FIGS. 6A and 6B provide the PMR writer structures of FIGS. 5A and 5B, respectively, with bevel angles labeled.
Figure 6A:
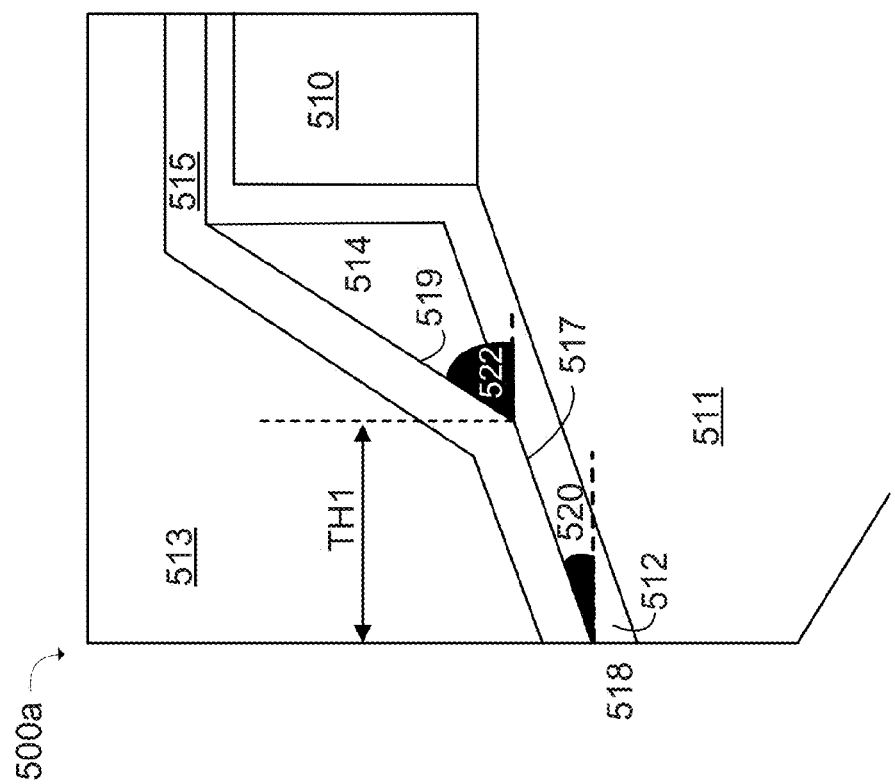

FIGS. 6A and 6B provide the same images of FIGS. 5A and 5B, respectively, with labeling of the relevant bevel angles so as to demonstrate the gradient write gap. In FIG. 6A, the non-magnetic layer between the main pole 511 and the shield 513, 515 is primarily defined by two bevel angles: (1) a first bevel 517 proximate the ABS 518 at a first angle 520, and (2) a second bevel 519 at a second angle 522 that is greater than the first angle 520.

In FIG. 6B, the gradient write gap portion 516 is added to the write gap 512 to create a gradient write gap. There is still the first bevel 517 at a first angle 520 (i.e., BV1A), a second bevel 519 at a second angle 522 (i.e., BV2A), and there is now an intermediate third bevel 521 at a third angle 530 (i.e., the gradient write gap angle or GWGA). The gradient write gap angle 530 creates a more gradual transition from the write gap 512 into the non-magnetic spacer 514, i.e., a gradient. As such, the gradient write gap angle 530 is greater than the first angle 520 (BV1A), and less than the second angle 522 (BV2A). Additionally, inclusion of this additional gradient write gap portion 516 to create the gradient write gap creates two different throat heights, TH1 and TH2 (as shown in FIGS. 5 and 6). The narrow opening of the write gap 512 at TH2 increases SNR, while the wider write gap opening 516 at TH1 minimizes flux shunting.

TABLE 1

| | BV1A | BV2A | WG2 | TH1 | TH2 | GWGA | Hv | Hsw | dHy/dy | RevOW | MTW |
|---|---|---|---|---|---|---|---|---|---|---|---|
| Writer | 28 | 65 | | 90 | | | 8860 | 15211 | 269939 | 30.9 | 2.2 |
| Writer + GWG | 28 | 65 | 24 | 75 | 30 | 49 | 9097 | 15476 | 275789 | 33.3 | 2.2 |

Table 1 provides data demonstrating the advantages that may be obtained by implementing the presently disclosed gradient write gap. A write head having a constant width write gap (row 1) was compared with a write head having a gradient-write gap, in accordance with an embodiment of the present disclosure (row 2). The data in the table shows that the first angle 520 (BV1A) was approximately 28 degrees, and the second angle 522 (BV2A), was approximately 65 degrees, the throat height being about 90 units. In the GWG implementation, an intermediate gradient-write gap angle 530 (GWGA) of approximately 49 degrees was created. As discussed with respect to FIG. 6, the gradient-write gap implementation results in two different throat heights. The first throat height was about 75 units, and the second throat height was about 30 units. It can be seen in Table 1, that by adding the gradient write gap, revOW increased from 30.9 to 33.3.

In certain embodiments, it may be desirable for the constant write gap width portion of the write gap, i.e., TH2, to be zero units in length. However, in practice, it should also be considered that lapping techniques for magnetic write heads are not perfectly precise, and as such, the constant write gap portion TH2 allows for a certain margin of error in the lapping process without compromising manufacturing sigmas. In any case, it should be understood that both of these situations (inclusion or removal of the constant write gap portion) are within the scope of the present disclosure.

The gradient write gap may be an added feature to current PMR writers. One process proposed to implement gradient write gaps in PMR writers is to utilize the non-magnetic spacer 514 as a hard mask for its shadowing effects. An ion-beam mill process with proper mill angle and sweep angular range will create the gradient write gap at the junction of the trailing first bevel 517 and the second bevel 519. Examples of methods for forming a gradient write gap will now be discussed in greater detail.

Exemplary method embodiments of the present invention are described below. This method may be broken down into several exemplary components:
  regular write gap (WG) deposition
  WG cap layer deposition: to protect the write gap from gradient-write gap (GWG) milling
  non-magnetic spacer deposition
  GWG material deposition: to control GWG thickness
  GWG cap layer deposition: for mill endpoint registration
  GWG formation by ion mill or any other appropriate method.

These components may be re-arranged in different ways to create multiple methods by which to form an exemplary gradient write gap. To provide examples of how these steps may be re-arranged, three possible methods are discussed in greater detailed here as Process Routes 1, 2, and 3, which are depicted as image flow charts in FIGS. 7, 8, and 9, respectively.

Figure 7:
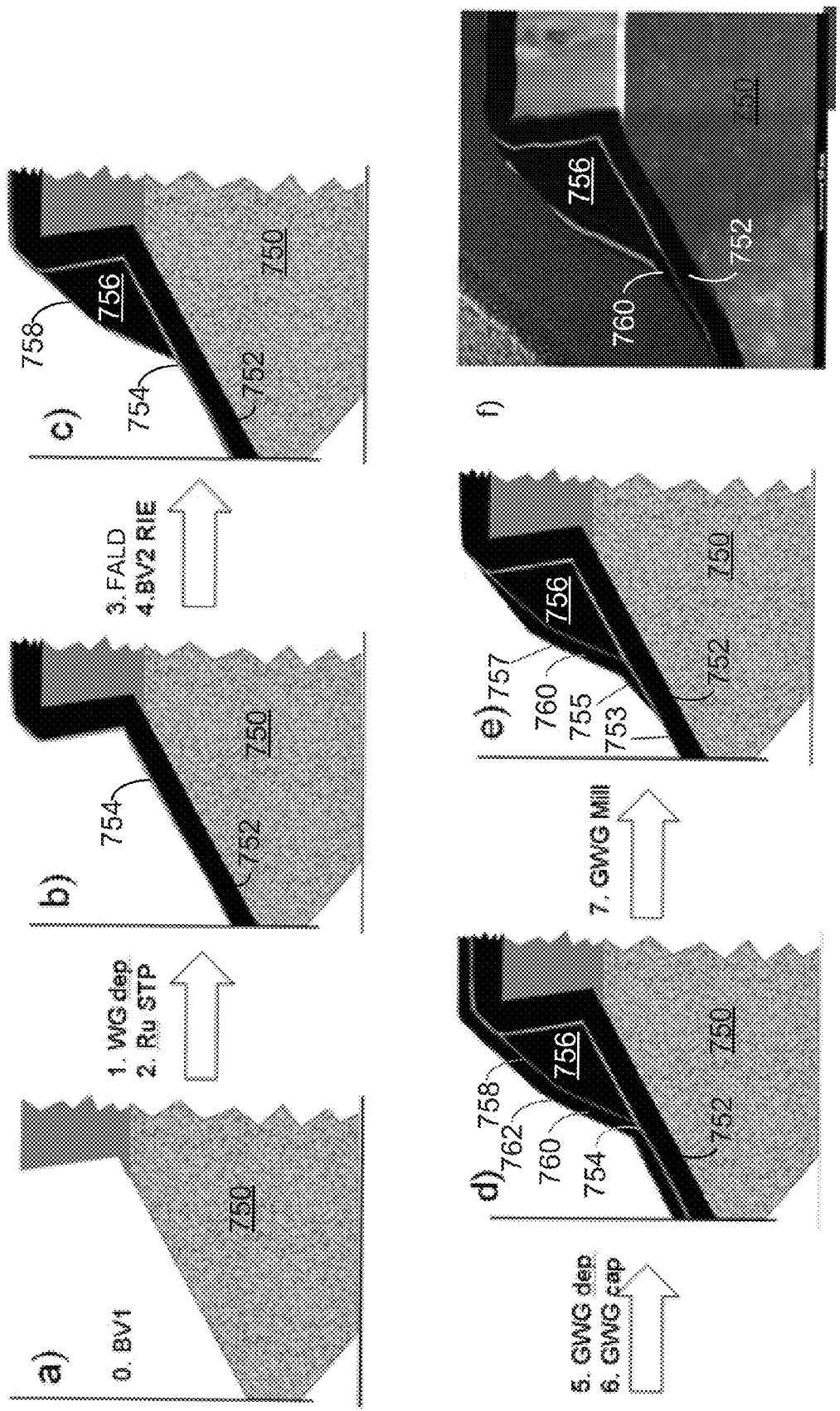
FIG. 7 provides an image flowchart of a first method by which a gradient write gap may be formed, in accordance with an embodiment of the present disclosure.

FIG. 7 provides a step-by-step breakdown of a first process route (Process Route 1) to form a gradient write gap. Process Route 1 may be summarized in the following eight steps, which are demonstrated in FIGS. 7(a)-7(f):

0. BV1 process (FIG. 7(a))—This is the starting point of the process. An angled surface is formed on the main pole 750;
1. WG dep—A regular write gap layer 752 is deposited on the main pole 750. One possible method for performing this step is fast ALD (atomic layer deposition). Alternative deposition methods might include physical vapor deposition or sputtering. (FIG. 7(b)). The write gap layer may comprise a non-magnetic material. Examples of such a non-magnetic material may include $Al_2O_3$ or Ru;
2. Ru STP—A write gap stop layer 754 is deposited on the regular write gap layer 752 to protect the write gap 752 from the gradient write gap milling process, which will be discussed in greater detail in step 7. The write gap stop layer 754 may comprise Ru, $Al_2O_3$, Ta, amorphous carbon or similar materials;
3. Spacer FALD—A non-magnetic spacer 756 is deposited on the write gap 752 and the write gap stop layer 754. Much like the write gap layer 752, the non-magnetic spacer 756 may comprise a non-magnetic material such as Ru or $Al_2O_3$. In a particular embodiment, the non-magnetic spacer 756 may comprise a different non-magnetic material from the write gap layer 752. For example, if the write gap layer 752 comprises Ru, then the non-magnetic spacer 756 may comprise $Al_2O_3$, or vice versa. In a particular embodiment, the non-magnetic spacer 756 may be deposited using fast ALD, or any other appropriate deposition method;
4. BV2 RIE—A second stop layer 758 is formed on the non-magnetic spacer 756. The second stop layer 758 may comprise Ru, $Al_2O_3$, Ta, amorphous carbon or similar materials, and may be formed via reactive ion etch (RIE)) (FIG. 7(c));
5. GWG dep—A gradient write gap (GWG) layer 760 is deposited over the write gap 752 and the non-magnetic spacer 756. This may be performed via fast ALD using a non-magnetic material, such as Ru or $Al_2O_3$ (FIG. 7(d));
6. GWG cap—A GWG cap layer 762, which may comprise Ru, $Al_2O_3$, Ta, amorphous carbon or similar materials, is deposited on the GWG layer 760 (FIG. 3(d));
7. GWG Mill—An ion mill is used to shape the GWG layer 760 (FIG. 3(e)). It can be seen in FIG. 7(e) that a portion of the GWG layer 760 directly above the write gap 752 has been milled away to form a more gradual, sloped shape in the GWG layer 760. The re-shaped gradient write gap layer 760 and the write gap layer 752 together form a gradient write gap. This step creates a three-bevel surface with each beveled-surface have a progressively increasing angle. A first bevel 753 is at an angle that is substantially determined by the angle of the regular write gap layer 752. A second bevel 755 is formed by the re-shaped gradient write gap layer 760, with the angle of the second bevel 755 being greater than the angle of the first bevel 753. And then a third bevel 757 extends from the second bevel 755, with the angle of the third bevel 757 substantially approximating the angle of the non-magnetic spacer 756, and being greater than the angle of the first and second bevels 753, 755.

FIG. 7(f) provides an image of an actual gradient write gap that has been formed using the Process 1 steps described above. It can be seen that the regular write gap layer 752 has a narrow opening on the left, leading to the air-bearing surface (ABS), and the GWG layer 760 creates a gradual widening of the write gap as it leads into the non-magnetic spacer 756.

Figure 8:
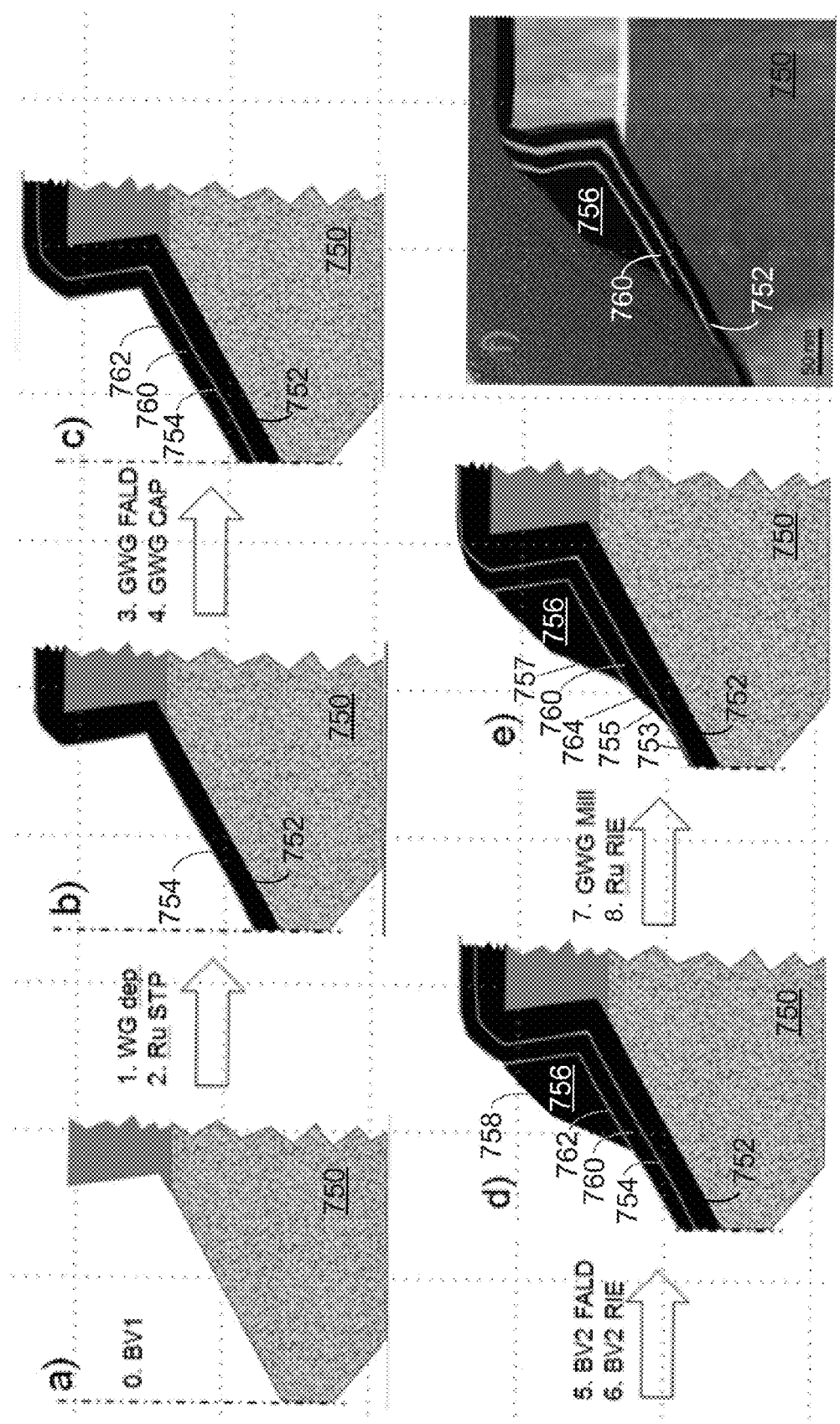
FIG. 8 provides an image flowchart of a second method by which a gradient write gap may be formed, in accordance with an embodiment of the present disclosure.

FIG. 8 provides a step-by-step breakdown of a second process route (Process Route 2) that may be used to form a gradient write gap, in accordance with an embodiment of the present disclosure. Process Route 2 may be summarized in the following nine steps, as shown in FIG. 8:

0. BV1 process—like Process Route 1, the process starts with a first angled surface being formed on the main pole 750;
1. WG dep—Again, as in Process Route 1, a regular write gap layer 752 is deposited on the main pole 750. One possible method for performing this step is fast ALD (atomic layer deposition). Alternative deposition methods might include physical vapor deposition or sputtering (FIG. 8(a));
2. Ru STP—A write gap stop layer 754 is deposited on the regular write gap layer 752 to protect the regular write gap layer 752 from the GWG milling process in step 7;
3. GWG dep—This is where Process Route 2 begins to differ from Process Route 1. In Process Route 1, a non-magnetic spacer 756 was deposited on the regular write gap layer 752, and the gradient write gap layer 760 was deposited over both the regular write gap layer and the non-magnetic spacer. Here, in Process Route 2, the gradient write gap layer 760 is deposited over the write gap layer 752 before deposition of the non-magnetic spacer 756. Deposition of the gradient write gap layer 760 may be performed via fast ALD, or any other appropriate deposition method. The gradient write gap layer 760 may comprise a non-magnetic material such as Ru or $Al_2O_3$ (FIG. 8(c));
4. GWG cap—A gradient write gap cap layer 762, which may comprise Ru, Ta, $Al_2O_3$, or similar non-magnetic materials, is deposited on the gradient write gap layer 760 (FIG. 8(c));
5. BV2 FALD—A non-magnetic spacer 756 (i.e., BV2) is now formed on the regular write gap layer 752 and the gradient write gap layer 760 (FIG. 8(d));
6. BV2 RIE—A BV2 stop layer 758 is formed on the non-magnetic spacer 756. The BV2 stop layer 758 may comprise Ru, Ta, $Al_2O_3$, or similar non-magnetic materials, and may be formed via reactive ion etch (RIE)) (FIG. 8(d));
7. GWG Mill—An ion mill may now be used to shape the GWG layer 760 (FIG. 8(e)). It can be seen in FIG. 8(e) that a portion of the GWG layer 760 directly above the write gap 752 has been milled away to form a more gradual, sloped shape in the GWG layer 760. Once again, three contiguous beveled surfaces have been formed that progressively increase in angle: a first bevel 753 has a first angle approximating the regular write gap layer 752, a second bevel 755 has a second angle that is milled into the gradient write gap layer 760 and is greater than the first angle, and a third bevel 757 has a third angle substantially determined by the non-magnetic spacer 756, the third angle being greater than the angles of the first and second bevels 753, 755.
8. Ru RIE—A final Ru cap layer 764 is formed over the re-shaped GWG layer 760. The Ru cap layer 764 may be formed via reactive ion etch using Ru, or another similar non-magnetic material.

Figure 9:
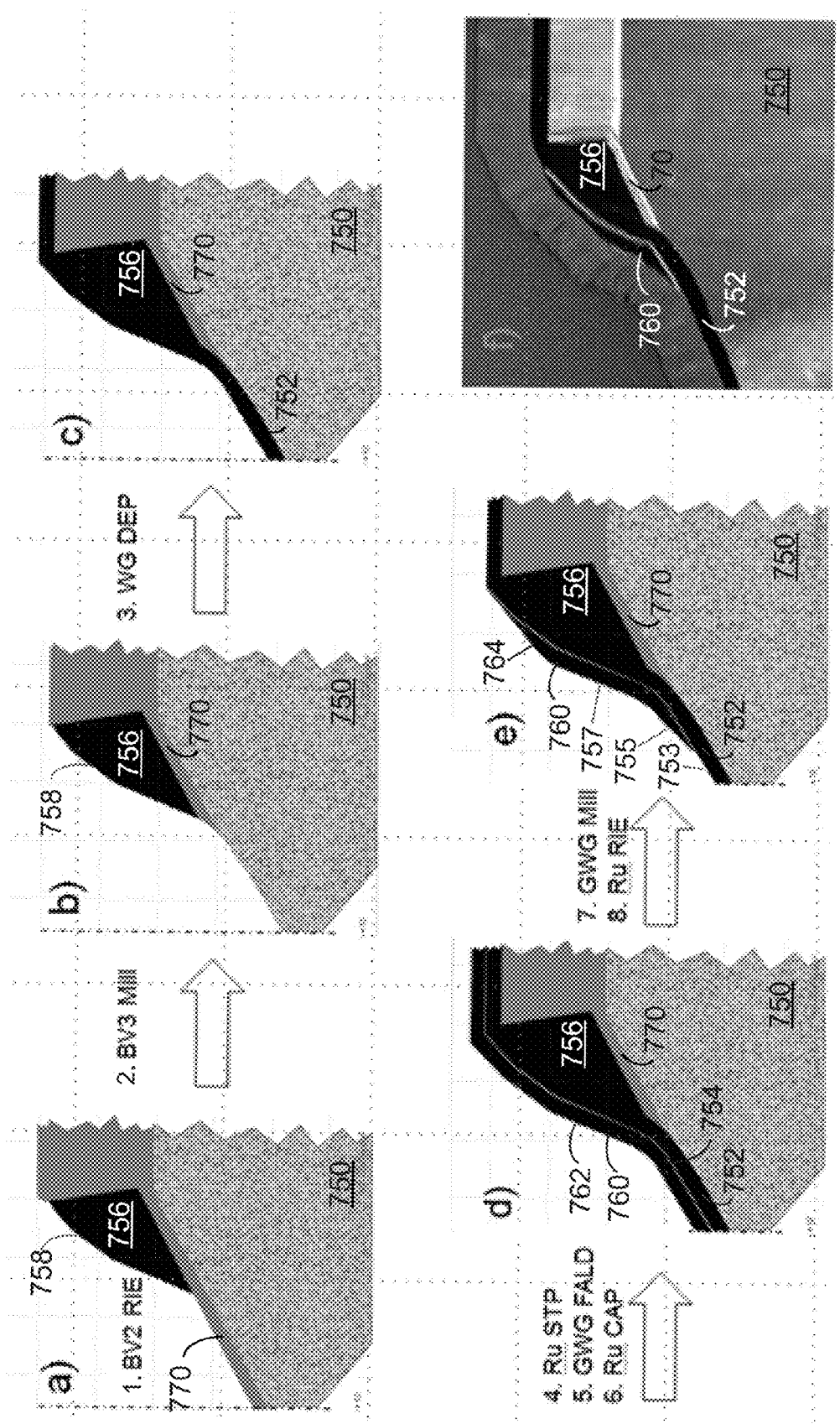
FIG. 9 provides an image flowchart of a third method by which a gradient write gap may be formed, in accordance with an embodiment of the present disclosure.

FIG. 9 provides a step-by-step breakdown for a third process route (Process Route 3) to form a gradient write gap, in accordance with an embodiment of the present disclosure. Process Route 3 may be summarized using the following steps, as shown in FIG. 9:
1. Each of the following steps have been performed in FIG. 9(a): BV1 process—like Process Routes 1 and 2, the process starts with a first angled surface formed on the main pole 750;
Deposit BV3 stop layer—Unlike Process Routes 1 and 2, Process Route 3 includes a BV3 non-magnetic layer 770 that is deposited on the main pole 750;
Spacer FALD—A non-magnetic spacer 756 (i.e., BV2) is formed on the BV3 non-magnetic layer 770. The non-magnetic spacer 756 may comprise a non-magnetic material, as has been discussed previously;
BV2 RIE—A BV2 stop layer 758 is formed on the non-magnetic spacer 756. The BV2 stop layer 758 may comprise Ru, or other non-magnetic material, and may be formed via reactive ion etch (RIE));
2. BV3 Mill—The BV3 non-magnetic layer 770 is re-shaped using an ion mill;
3. WG DEP—A regular write gap layer 752 is deposited over the main pole 750, the non-magnetic spacer 756, and the BV3 non-magnetic layer 770. This may be performed using fast ALD;
4. Ru STP—An write stop layer 756 is deposited on the regular write gap layer 752 (e.g., Ru or amorphous carbon or similar materials);
5. GWG FALD—A gradient write gap layer 760 is deposited on the regular write gap layer 752 (e.g., fast ALD and Al2O3, etc);
6. Ru CAP—A gradient write gap layer 762 is deposited on the gradient write gap 760 (e.g., Ru);
7. GWG Mill—The gradient write gap layer 760 is shaped using an ion mill. This results in the formation of a first bevel 753, a second bevel 755, and a third bevel 757, similar to the end results of Processes 1 and 2 (FIGS. 7-8).
8. Ru RIE—A final Ru cap layer 764 is formed over the re-shaped gradient layer 760.

In each of the processes discussed above, the regular write gap layer 752, the gradient write gap layer 760, and the non-magnetic spacer 756 together form a non-magnetic layer between the main pole 750 and a magnetic shield. As has been discussed extensively above, each of the three different process routes (FIGS. 7-9) result in the end goal of a wedge-shaped gradient write gap. The gradient write gap has a narrower write gap opening at the air-bearing surface and a gradual slope into the non-magnetic spacer 756. The gradual slope is achieved by shaping the gradient write gap layer 760 to form a bevel 755 having an angle that is greater than the angle formed by the regular write gap layer 752 and smaller than the angle formed by the non-magnetic spacer 756.

In the foregoing specification, embodiments of the disclosure have been described with reference to specific exemplary features thereof. It will, however, be evident that various modifications and changes may be made thereto without departing from the broader spirit and scope of the disclosure. The specification and figures are, accordingly, to be regarded in an illustrative rather than a restrictive sense. Although the disclosure has been presented with reference only to the presently preferred embodiments, those of ordinary skill in the art will appreciate that various modifications can be made without departing from this disclosure. Accordingly, this disclosure is defined only by the following claims.

The invention claimed is:
1. A method for forming a magnetic recording pole comprising:
depositing a write gap layer;
depositing a gradient write gap layer, the write gap layer and the gradient write gap layer in communication with one another to form a write gap; and
shaping the gradient write gap layer such that the write gap formed by the write gap layer and the gradient write gap layer is narrower on a first end than on a second end;
depositing a non-magnetic spacer, wherein the non-magnetic spacer comprises a non-magnetic material, and wherein the write gap layer is deposited before the non-magnetic spacer is deposited,
wherein the write gap is configured to interact with an air-bearing surface on the first end and the non-magnetic spacer on the second end.
2. The method of claim 1, wherein the non-magnetic spacer is deposited before the gradient write gap layer is deposited, the non-magnetic spacer is deposited on the write gap layer, and the gradient write gap layer is deposited on the write gap layer and the non-magnetic spacer.

3. The method of claim 1, wherein the non-magnetic spacer is deposited after the gradient write gap layer is deposited, and the non-magnetic spacer is deposited on the gradient write gap layer.

4. The method of claim 1, wherein the non-magnetic spacer is deposited before the write gap layer is deposited, and the write gap layer is deposited on the non-magnetic spacer.

5. The method of claim 1, wherein the non-magnetic spacer comprises at least one of Ru or $Al_2O_3$.

6. The method of claim 1, wherein the write gap layer is deposited using atomic layer deposition.

7. The method of claim 1, wherein depositing the write gap layer further comprises depositing a write gap stop layer on the write gap layer, wherein the write gap stop layer protects the write gap layer.

8. The method of claim 1, wherein the gradient write gap is deposited using fast ALD.

9. The method of claim 1, wherein the gradient write gap comprises a non-magnetic material.

10. The method of claim 9, wherein the gradient write gap comprises at least one of Ru or $Al_2O_3$.

* * * * *